(12) United States Patent
Tago (10) Patent No.: US 7,525,189 B2
(45) Date of Patent: Apr. 28, 2009

(54) SEMICONDUCTOR DEVICE, WIRING BOARD, AND MANUFACTURING METHOD THEREOF

(75) Inventor: Masamoto Tago, Tokyo (JP)

(73) Assignee: NEC Corporation, Tokyo (JP)

( * ) Notice: Subject to any disclaimer, the term of this patent is extended or adjusted under 35 U.S.C. 154(b) by 33 days.

(21) Appl. No.: 11/569,423

(22) PCT Filed: May 18, 2005

(86) PCT No.: PCT/JP2005/009061

§ 371 (c)(1),
(2), (4) Date: Nov. 20, 2006

(87) PCT Pub. No.: WO2005/114728

PCT Pub. Date: Dec. 1, 2005

(65) Prior Publication Data

US 2008/0001309 A1      Jan. 3, 2008

(30) Foreign Application Priority Data

May 21, 2004    (JP)    ............................. 2004-152618

(51) Int. Cl.
*H01L 23/48*    (2006.01)
(52) U.S. Cl. ...................... 257/698; 257/629; 257/700; 257/E23.011; 438/106
(58) Field of Classification Search ................ 257/629, 257/698, 700, E23.011; 438/106
See application file for complete search history.

(56) References Cited

U.S. PATENT DOCUMENTS

| 6,871,396 | B2 * | 3/2005 | Sugaya et al. ................. 29/860 |
| 7,095,623 | B2 * | 8/2006 | Suwa et al. ................. 361/795 |
| 7,208,844 | B2 * | 4/2007 | Andoh ....................... 257/787 |
| 7,377,030 | B2 * | 5/2008 | Shuto et al. ................... 29/830 |
| 2005/0225956 | A1 * | 10/2005 | Suwa et al. ................. 361/795 |
| 2008/0237890 | A1 * | 10/2008 | Tago ......................... 257/778 |

* cited by examiner

*Primary Examiner*—Victor A Mandala
(74) *Attorney, Agent, or Firm*—Sughrue Mion, PLLC (57) ABSTRACT

A wiring board (20) includes a first wiring portion (10) having a plurality of wiring layers (1) and a plurality of external connecting bumps (5), and a second wiring portion (15) integrated with the first wiring portion in the direction of thickness. The thermal expansion coefficient of the second wiring portion is made smaller than that of the first wiring portion, and equal to that of a semiconductor chip (30) to be mounted on the wiring board. This suppresses the internal stress resulting from the thermal expansion coefficient difference between the semiconductor chip and wiring board, and increases the reliability of a semiconductor device (50) obtained by mounting the semiconductor chip on the wiring board. The sizes of the opposing surfaces of the first and second wiring portions are also made equal. This requires only one second wiring portion to be formed even when improving the performance of the semiconductor device by mounting a plurality of semiconductor chips on the wiring board, thereby improving the performance at a low cost.

9 Claims, 8 Drawing Sheets

SEMICONDUCTOR DEVICE, WIRING BOARD, AND MANUFACTURING METHOD THEREOF

This application claims priority from PCT Application No. PCT/JP2005/009061 filed May 18, 2005, and from Japanese Patent Application No. 2004-152618 filed May 21, 2004, which applications are incorporated herein by reference.

TECHNICAL FIELD

The present invention relates to a semiconductor device, a wiring board, and a manufacturing method thereof and, more particularly, to a semiconductor device having a structure in which a semiconductor chip is mounted on a wiring board (to be simply referred to as "a semiconductor device" hereinafter), the wiring board used in the semiconductor device, and a manufacturing method thereof.

BACKGROUND ART

To decrease the size and improve the performance of an electronic apparatus, the mounting density of a semiconductor chip or semiconductor device is being increased in recent years. The mounting density of a semiconductor chip is in many cases increased by mounting the semiconductor chip on a wiring board by wireless bonding, particularly, flip chip bonding. The mounting density of a semiconductor device is often increased by mounting the semiconductor device on a wiring board (which is different from a wiring board forming the semiconductor device. This wiring board will be referred to as "a mother board" hereinafter) by surface mounting. For semiconductor devices, various packaging methods suited to surface mounting such as a ball grid array semiconductor package have been developed. Flip chip bonding and surface mounting are advantageous in downsizing and micropatterning a semiconductor chip and semiconductor device, and increasing the number of pins. Flip chip bonding and surface mounting are also advantageous in increasing the operating speed of an integrated circuit or the like formed in a semiconductor chip or semiconductor device, since the wiring resistance can be made lower than that of wiring bonding.

To improve the performance and increase the operating speed of, e.g., a system large-scale integrated circuit (system LSI), it is possible to improve the performance and increase the operating speed by mounting a plurality of LSIs and passive parts on one semiconductor chip, rather than by improving the performance and increasing the operating speed by one LSI. For this reason, a system LSI (system on chip) of this type is beginning to be widely used.

When forming a semiconductor device by mounting a highly integrated semiconductor chip having a large number of pins on a desired wiring board, a large difference between the thermal expansion coefficients of the semiconductor chip and wiring board increases the internal stress of the semiconductor device by heat generated when an electric current is supplied to the semiconductor chip. This causes stress concentration in, e.g., the junction portion between the semiconductor chip and wiring board in the semiconductor device or the connecting portion between the semiconductor device and a mother board, so disconnection or the like readily occurs. As a consequence, the reliability of the semiconductor device or an electronic apparatus using the semiconductor device decreases. To obtain a highly reliable semiconductor device or electronic apparatus, therefore, a resin is often filled in the junction portion between a semiconductor chip and wiring board of the semiconductor device, in the junction portion between the semiconductor device and a mother board, and in peripheral portions of these junction portions, thereby reinforcing the junction portions.

Japanese Patent Laid-Open No. 64-32662 (reference 1) describes a semiconductor package structure (semiconductor device) which increases the reliability by interposing, between a semiconductor chip and wiring board (large board), a small board having a specific thermal expansion coefficient, i.e., a small board whose thermal expansion coefficient difference from the semiconductor chip is smaller than that from the wiring board (large board). The semiconductor chip is mounted on the small board, and a plurality of small boards each having the semiconductor chip are mounted on the wiring board (large board).

Although this is not an invention of a semiconductor device, Japanese Patent Laid-Open No. 8-167630 (reference 2) describes a chip connection structure in which an integrated circuit chip and wiring board are connected by direct through-hole connection by interposing an adhesive film between the integrated circuit chip and wiring board, and making the thermal expansion coefficient of the wiring board substantially equal to that of the integrated circuit.

DISCLOSURE OF INVENTION

Problems to be Solved by the Invention

As described in reference 1, it is useful to interpose a small board having a specific thermal expansion coefficient between a wiring board (large board) and semiconductor chip, in order to suppress the internal stress of the semiconductor device.

Unfortunately, a demand has always arisen for improving the performance of a semiconductor device, so the number of semiconductor chips mounted on a wiring board keeps increasing. It is also necessary to mount elements, e.g., passive parts such as capacitors and resistors, other than the semiconductor chips on the wiring board.

Accordingly, if small boards are mounted on a wiring board (large board) in one-to-one correspondence with semiconductor chips as described in reference 1, it is difficult to manufacture a high-performance semiconductor device at a low cost.

Furthermore, it is extremely difficult, by only interposing a specific small board, to mount a semiconductor chip which is micropatterned and given a large number of pins in order to improve the performance on a wiring board (large board).

The present invention has been made in consideration of the above situation, and has as its object to improve the performance and reduce the cost of a semiconductor device while maintaining its high reliability.

Means for Solving the Problems

To achieve the above object, a semiconductor device of the present invention is characterized by comprising a wiring board comprising a plurality of connecting terminals arranged on one surface in a direction of thickness and a plurality of external connecting bumps arranged on the other surface in the direction of thickness, and at least one semiconductor chip connected to the connecting terminals, wherein the wiring board comprises a first wiring portion comprising a plurality of wiring layers and the external connecting bumps, and a second wiring portion electrically connected to the first wiring portion and integrated with the first wiring portion in the direction of thickness, the connecting terminals are made of contact plugs formed in through holes extending through the second wiring portion in the direction of thickness, sizes of opposing surfaces of the first wiring portion and the second wiring portion are equal, and a thermal expansion coefficient of the second wiring portion is smaller than a thermal expansion coefficient of the first wiring portion and equal to a thermal expansion coefficient of the semiconductor chip.

Also, a wiring board of the present invention is characterized by comprising a first wiring portion comprising a plurality of wiring layers and a plurality of external connecting bumps, and a second wiring portion comprising a plurality of connecting terminals configured to connect to at least one semiconductor chip, wherein the second wiring portion is electrically connected to the first wiring portion and integrated with the first wiring portion in a direction of thickness, the connecting terminals are made of contact plugs formed in through holes extending through the second wiring portion in the direction of thickness, sizes of opposing surfaces of the first wiring portion and the second wiring portion are equal, and a thermal expansion coefficient of the second wiring portion is smaller than a thermal expansion coefficient of the first wiring portion and equal to a thermal expansion coefficient of the semiconductor chip.

Furthermore, a wiring board manufacturing method of the present invention is characterized by comprising the steps of forming a first wiring portion comprising a plurality of wiring layers and a plurality of external connecting bumps, and forming a second wiring portion comprising a plurality of connecting terminals configured to connect to at least one semiconductor chip, such that the second wiring portion is integrated with the first wiring portion in a direction of thickness, wherein the connecting terminals are made of contact plugs formed in through holes extending through the second wiring portion in the direction of thickness, sizes of opposing surfaces of the first wiring portion and the second wiring portion are equal, and a thermal expansion coefficient of the second wiring portion is smaller than a thermal expansion coefficient of the first wiring portion and equal to a thermal expansion coefficient of the semiconductor chip.

Effects of the Invention

In the present invention, a wiring board has a first wiring portion including a plurality of wiring layers and the like, and a second wiring portion integrated with the first wiring portion in the direction of thickness. The thermal expansion coefficient of the second wiring portion is smaller than that of the first wiring portion, and equal to that of a semiconductor chip. This suppresses the internal stress resulting from the thermal expansion coefficient difference between the semiconductor chip mounted on the second wiring portion and the wiring board. Accordingly, the reliability of a semiconductor device obtained by mounting the semiconductor chip on the wiring board can increase.

Also, when this semiconductor device is surface-mounted on a mother board, the first and second wiring portions exist between the semiconductor chip and mother board. This reduces the internal stress resulting from the thermal expansion coefficient difference between the semiconductor chip and mother board. Therefore, the reliability of an electronic apparatus in which the semiconductor device is mounted on the mother board can increase.

Furthermore, the sizes of the opposing surfaces of the first and second wiring portions of the wiring board are equal. Accordingly, only one second wiring portion need be formed even when improving the performance of the semiconductor device by mounting a plurality of semiconductor chips on the wiring board. As a consequence, the performance of the semiconductor device can improve at a low cost.

Moreover, the first wiring portion of the present invention makes it possible to extend the terminal pitch and optimally connect interconnections of a plurality of mounted semiconductor chips, thereby improving the performance and reducing the cost.

As described above, the present invention can provide a highly reliable semiconductor device capable of improving the performance at a low cost. The use of this semiconductor device facilitates providing a high-reliability, high-performance electronic apparatus.

BEST MODE FOR CARRYING OUT THE INVENTION

Embodiments of a semiconductor device, a wiring board, and a manufacturing method thereof of the present invention will be explained in detail below with reference to the accompanying drawings.

Semiconductor Device and Wiring Board (First Embodiments)

Figure 1:
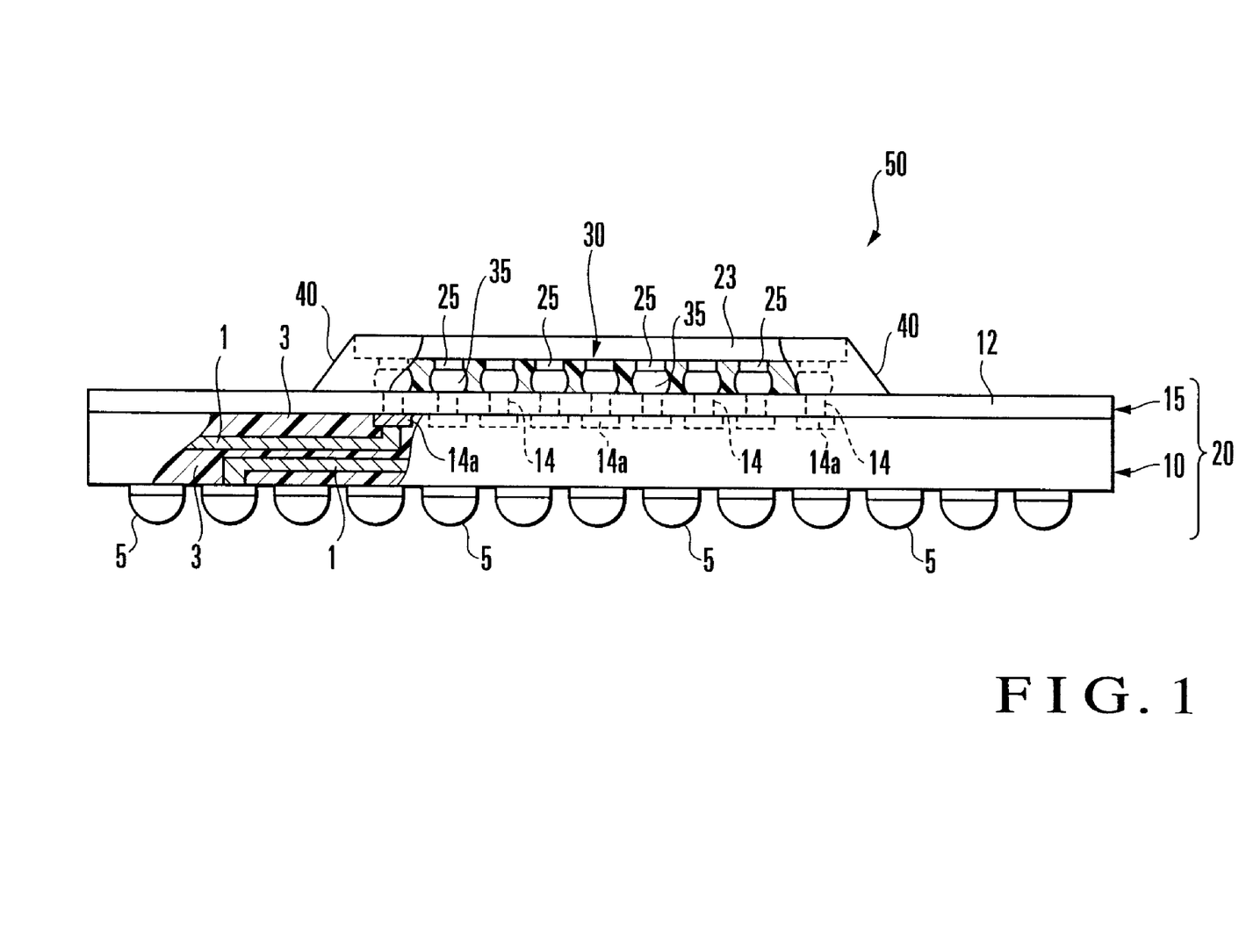
FIG. 1 is a partially cutaway side view schematically showing the first embodiments of a semiconductor device and wiring board of the present invention.

A semiconductor device 50 shown in FIG. 1 corresponds to the first embodiment of a semiconductor device of the present invention, in which a plurality of semiconductor chips 30 are mounted on a wiring board 20 by flip chip bonding. However, FIG. 1 shows only one semiconductor chip 30.

The wiring board 20 corresponds to the first embodiment of a wiring board of the present invention, and comprises a first wiring portion 10, and a second wiring portion 15 electrically connected to the first wiring portion 10 and integrated with the first wiring portion 10 in the direction of thickness (i.e., stacked on the first wiring portion 10). A plurality of wiring layers 1 (two layers in the example shown in FIG. 1) are formed in the first wiring portion 10, and interlayer dielectric films 3 are formed around the wiring layers 1. Also, a plurality of external connecting bumps 5 are formed one surface in the direction of thickness of the first wiring portion 10, such that each external connecting bump 5 electrically connects to a predetermined wiring layer 1.

On the other hand, the second wiring portion 15 has a base 12, and connecting terminals 14 which extend through the base 12 in the direction of thickness. The total number of the connecting terminals 14 can be the same as that of electrode terminals 25 formed in the semiconductor chip 30. Each connecting terminal 14 is made of a contact plug (to be referred to as "a contact plug 14" hereinafter) formed in a through hole which extends through the second wiring portion 15 (base 12) in the direction of thickness. Each contact plug 14 has a thin land portion 14a on the side of the first wiring portion 10. The second wiring portion 15 is integrated with the first wiring portion 10 in the direction of thickness, such that the land portion 14a of each contact plug 14 is in direct contact with a predetermined wiring layer 1. The planar size of the second wiring portion 15 is equal to that of the first wiring portion 10. That is, the sizes of the opposing surfaces of the first wiring portion 10 and second wiring portion 15 are equal.

"The planar size of the second wiring portion 15 is equal to that of the first wiring portion 10" means that the difference between the planar area of the second wiring portion 15 and that of the first wiring portion 10, i.e., the difference between the areas of the opposing surfaces of the second wiring portion 15 and first wiring portion 10 is about 1,500 mm$^2$ or less.

Each semiconductor chip 30 is obtained by forming an integrated circuit such as an LSI on, e.g., a silicon board 23, and an internal connecting bump 35 connects each electrode terminal 25 formed in the semiconductor chip 30 to a predetermined contact plug 14. If necessary, as shown in FIG. 1, the junction portion between the semiconductor chip 30 and second wiring portion 15 can be reinforced by filling a resin 40 in the space between the semiconductor chip 30 and second wiring portion 15 and in the periphery of the space. As the resin 40, it is favorable to appropriately select, e.g., an epoxy resin which produces no excess stress in the junction portion between the semiconductor chip 30 and second wiring portion 15. It is also possible to encapsulate only the periphery of the semiconductor chip 30 with the resin 40.

In the semiconductor device 50 having the above arrangement, the material of the base 12 of the second wiring portion 15 is selected so that the thermal expansion coefficient of the second wiring portion 15 is smaller than that of the first wiring portion 10, and equal to that of each semiconductor chip 30. When each semiconductor chip 30 is a silicon chip, for example, silicon, ceramics, or photosensitive glass can be used as the material of the base 12. These materials facilitate making the thermal expansion coefficient of the second wiring portion 15 equal to that of the semiconductor chip 30.

"The thermal expansion coefficient of the second wiring portion 15 is smaller than that of the first wiring portion 10" means that the thermal expansion coefficient of the whole second wiring portion 15 is smaller than that of the whole first wiring portion 10. Also, "the thermal expansion coefficient of the second wiring portion 15 is equal to that of the semiconductor chip 30" means that the difference between the thermal expansion coefficient of the whole second wiring portion 15 and that of the whole semiconductor chip 30 is about 10 ppm/° C. or less.

Since the thermal expansion coefficient of the second wiring portion 15 is equal to that of each semiconductor chip 30, it is possible to suppress the internal stress caused by the thermal expansion coefficient difference between the semiconductor chip 30 and wiring board 20 in the semiconductor device 50. Also, when the semiconductor device 50 is surface-mounted on a mother board, the first wiring portion 10 and second wiring portion 15 exist between the semiconductor chip 30 and mother board, and this reduces the internal stress caused by the thermal expansion coefficient difference between the semiconductor chip 30 and mother board.

In addition, since the planar size of the second wiring portion 15 is equal to that of the first wiring portion 10, only one second wiring portion 15 need be formed even when improving the performance of the semiconductor device 50 by mounting another element in addition to the semiconductor chip 30 on the wiring board 20, and the other element can be easily mounted on the second wiring portion 15. Note that an embodiment in which another element is mounted will be described later.

Accordingly, it is readily possible not only to improve the performance but also to increase the reliability of the semiconductor device 50. Also, a high-reliability, high-performance electronic apparatus is readily obtained by mounting the semiconductor device 50 on a mother board.

Semiconductor Device and Wiring Board (Second Embodiments)

Figure 2:
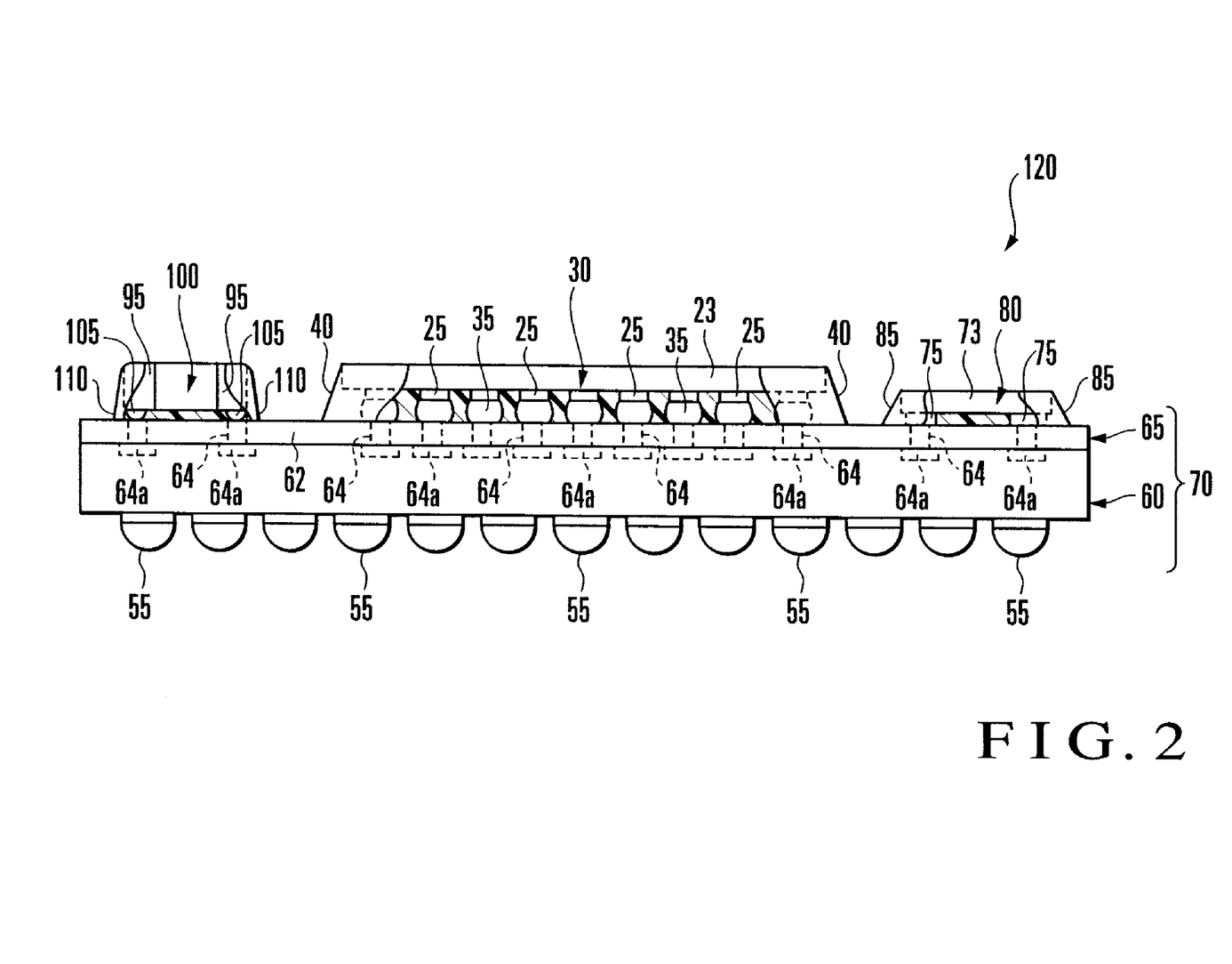
FIG. 2 is a partially cutaway side view schematically showing the second embodiments of the semiconductor device and wiring board of the present invention.

A semiconductor device 120 shown in FIG. 2 corresponds to the second embodiment of the semiconductor device of the present invention, in which a second semiconductor chip 80 and passive part 100 are mounted on a wiring board 70 in addition to a plurality of semiconductor chips 30 (FIG. 2 shows only one semiconductor chip 30).

The wiring board 70 corresponds to the second embodiment of the wiring board of the present invention. In the wiring board 70, the number of wiring layers (not shown) and the shape of each wiring layer in a first wiring portion 60, the number and arrangement of external connecting bumps 55 of the first wiring portion 60, and the number and arrangement of contact plugs 64 formed in a base 64 of a second wiring portion 65 are selected so that the plurality of semiconductor chips 30, the second semiconductor chip 80, and the passive part 100 can be mounted. Reference numeral "64a" in FIG. 2 denotes a land portion formed at one end of the contact plug 64.

The arrangement of the semiconductor chip 30 is the same as the semiconductor chip 30 in the semiconductor device 50 of the first embodiment shown in FIG. 1, so the same reference numerals as used in FIG. 1 denote the semiconductor chip 30 and its constituent members, and an explanation thereof will be omitted. An internal connecting bump 35 connects each electrode terminal 25 formed in the semiconductor chip 30 to a predetermined contact plug 64.

The second semiconductor chip 80 is obtained by forming an integrated circuit on, e.g., a silicon board 73, and mounted on the second wiring portion 65 by flip chip bonding without using any solder bumps. Therefore, each electrode terminal 75 formed in the second semiconductor chip 80 directly connects to a predetermined contact plug 64. If necessary, as shown in FIG. 2, the junction portion between the semiconductor chip 80 and second wiring portion 65 can be reinforced by filling a resin 85 in the space between the semiconductor chip 80 and second wiring portion 65 and in the periphery of the space.

The passive part 100 is, e.g., a functional element such as a capacitor or resistor, and each electrode terminal 95 formed in the passive part 100 connects to a predetermined contact plug 64 via a solder bump 105. If necessary, as shown in FIG. 2, the junction portion between the passive part 100 and second wiring portion 65 can be reinforced by filling a resin 110 in the space between the passive part 100 and second wiring portion 65 and in the periphery of the space.

In the semiconductor device 120 having the above arrangement, as in the semiconductor device 50 of the first embodiment shown in FIG. 1, the planar size of the second wiring portion 65 is equal to that of the first wiring portion 60. Also, the material of the base 62 of the second wiring portion 65 is selected such that the thermal expansion coefficient of the second wiring portion 65 is smaller than that of the first wiring portion 60, and equal to that of each semiconductor chip 30.

In the semiconductor device 120, therefore, it is possible to suppress the internal stress caused by the thermal expansion coefficient difference between the semiconductor chip 30 and wiring board 70. It is also possible to suppress the internal stress caused by the thermal expansion coefficient difference between each of the second semiconductor chip 80 and passive part 100 and the wiring board 70. When the semiconductor device 120 is surface-mounted on a mother board, the first wiring portion 60 and second wiring portion 65 exist between each of the semiconductor chip 30, second semiconductor chip 80, and passive part 100 and the mother board, and this reduces the internal stress caused by the thermal expansion coefficient difference between each of the semiconductor chip 30, second semiconductor chip 80, and passive part 100 and the mother board. Furthermore, only one second wiring portion 65 need be formed because the planar size of the second wiring portion 65 is equal to that of the first wiring portion 60.

Accordingly, it is readily possible not only to improve the performance but also to increase the reliability of the semiconductor device 120. Also, a high-reliability, high-performance electronic apparatus is readily obtained by mounting the semiconductor device 120 on a mother board.

Semiconductor Device (Third Embodiment)

Figure 3:
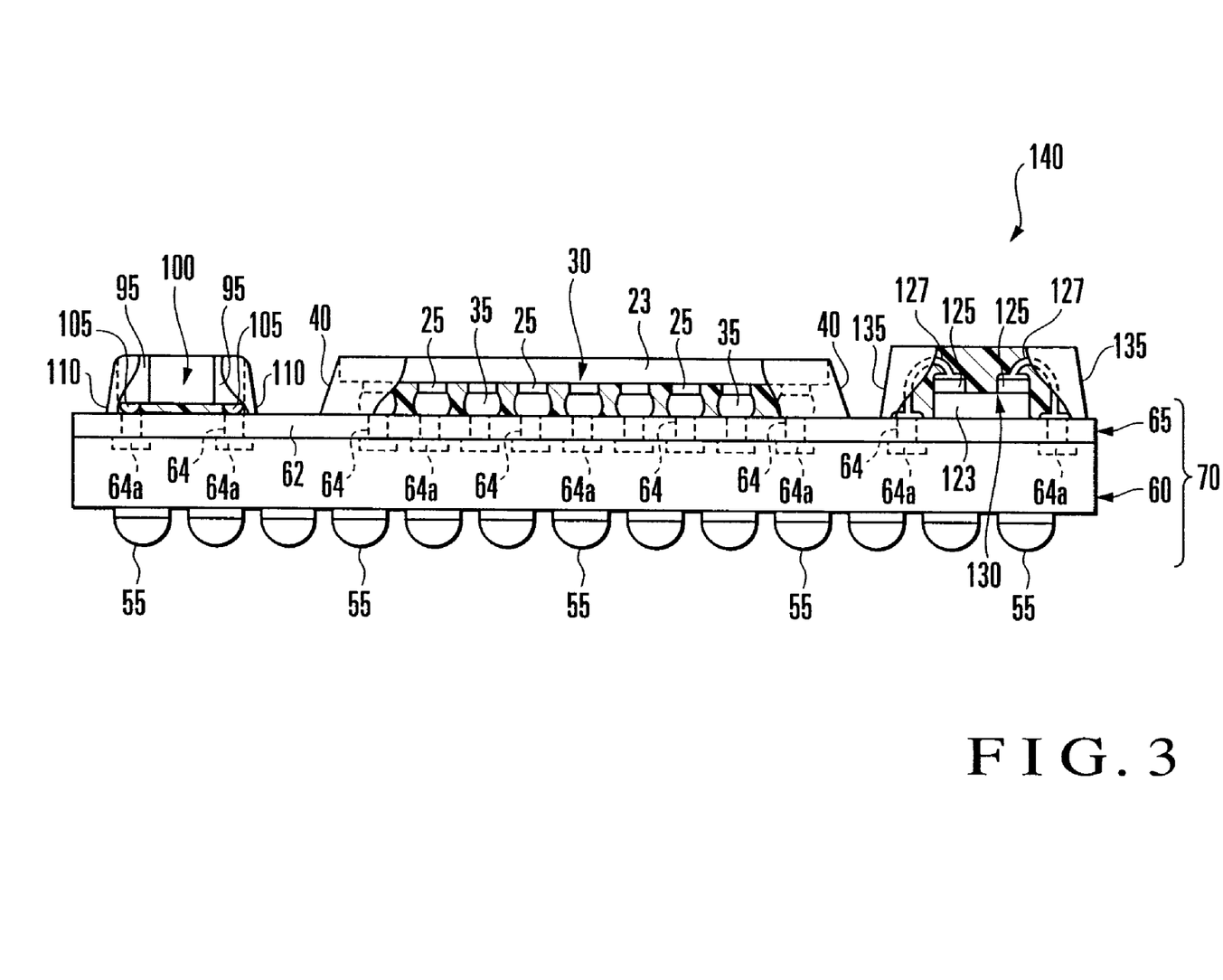
FIG. 3 is a partially cutaway side view schematically showing the third embodiment of the semiconductor device of the present invention.

A semiconductor device 140 shown in FIG. 3 corresponds to the third embodiment of the semiconductor device of the present invention, in which a passive part 100 and third semiconductor chip 130 are mounted on a wiring board 70 in addition to a plurality of semiconductor chips 30 (FIG. 3 shows only one semiconductor chip 30).

The arrangement of the wiring board 70 is the same as the wiring board 70 in the semiconductor device 120 of the second embodiment shown in FIG. 2, so the same reference numerals as used in FIG. 2 denote the wiring board 70 and its constituent members, and an explanation thereof will be omitted. Likewise, the arrangement of the passive part 100 is the same as the passive part 100 in the semiconductor device 120 of the second embodiment shown in FIG. 2, so the same reference numerals as used in FIG. 2 denote the passive part 100 and its constituent members, and an explanation thereof will be omitted.

The third semiconductor chip 130 is obtained by forming an integrated circuit on, e.g., a silicon board 123, and mounted on a second wiring portion 65 by wire bonding by using thin metal wires 127. The thin metal wire 127 connects each electrode terminal 125 formed in the third semiconductor chip 130 to a predetermined contact plug 64.

The semiconductor device 130 having the above arrangement achieves the same technical effects as the semiconductor device 120 of the second embodiment described above.

Semiconductor Device (Modifications)

Although a plurality of semiconductor chips are mounted on the wiring board by flip chip bonding in the above-mentioned semiconductor devices, one semiconductor chip may also be mounted on the wiring board by flip chip bonding. It is possible to appropriately select whether to mount an element other than at least one semiconductor chip on the wiring board. When mounting an element other than the semiconductor chip on the wiring board, this element to be mounted is appropriately selected in accordance with, e.g., the function and performance of a semiconductor device to be manufactured.

Also, when mounting an element other than the semiconductor chip on the wiring board, the mounting form can be either wireless bonding or wire bonding. Wireless bonding is favorable to increase the mounting density. When the productivity of the semiconductor device is taken into consideration, the element is preferably mounted by flip chip bonding similarly to the semiconductor chip.

If necessary, a desired number of reinforcing frame members (stiffeners) can be arranged on the second wiring portion. It is also possible to arrange a plurality of reinforcing frame members, and form a heat sink on these reinforcing frame members so as to cover mounted parts such as semiconductor chips.

Wiring Board (Modifications

The first and second wiring portions of the wiring board described above can be integrated by forming the first wiring portion on the base forming the second wiring portion, and forming the second wiring portion after that. It is also possible to integrate the first and second wiring portions by separately forming the first and second wiring portions, and bonding them by using an adhesive resin after that. Furthermore, when the interlayer dielectric film forming the first wiring portion is formed by a resin, the first and second wiring portions can be integrated by separately forming the first and second wiring portions, placing the second wiring portion on the first wiring portion, softening the interlayer dielectric film by heating while the second wiring portion is pressed against the first wiring portion as needed, and cooling the interlayer dielectric film after that.

When integrating the first and second wiring portions after they are separately formed, the first and second wiring portions can be electrically connected via a conductive material such as a solder bump. In this case, the junction portion between the first and second wiring portions can be reinforced, where necessary, by filling a resin in the space between the first and second wiring portions and in the periphery of the space.

Figure 4:
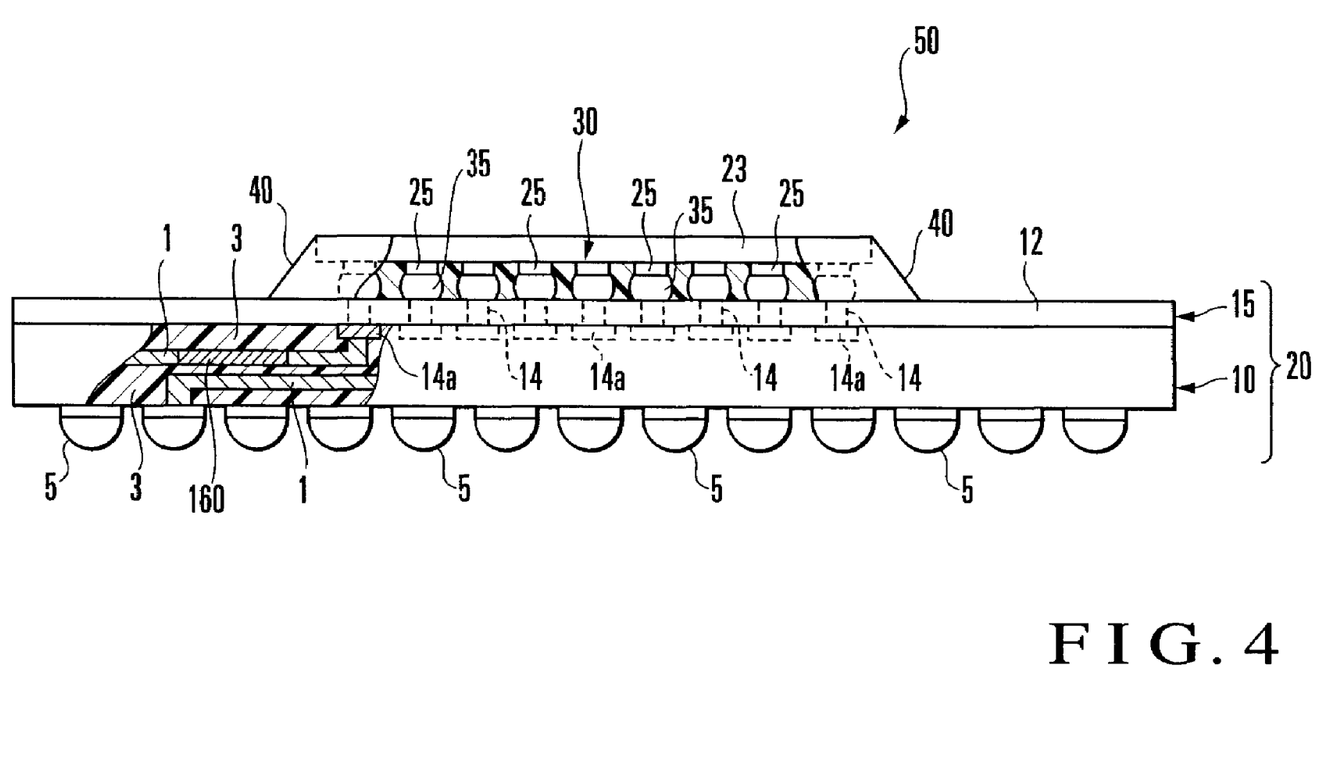
FIG. 4 is a partially cutaway side view schematically showing modifications of the semiconductor device and wiring board of the present invention.

As shown in FIG. 4, at least one functional element 160 can be formed, if necessary, in the first wiring portion 10 or on the surface of the second wiring portion 15 which faces the first wiring portion 10. Examples of the functional element 160 are a capacitor, decoupling capacitor, resistor, and inductor.

The number of contact plugs formed in the second wiring portion can be appropriately selected by taking account of the total sum of electrode terminals in at least one semiconductor chip to be mounted on the second wiring portion, and the total sum of electrode terminals in an element to be mounted in addition to the semiconductor chip.

For at least one semiconductor chip, the contact plugs are preferably formed in the second wiring portion in one-to-one correspondence with the electrode terminals formed in the semiconductor chip. Although a relaxation layer needs to be formed to relax the internal stress, even when one such layer is added, the formation of contact plugs as described above obviates the need to lay out interconnections in the second wiring portion for the semiconductor chip, so the internal stress can be readily suppressed while the designed characteristics of each semiconductor chip or characteristics close to the design values of the semiconductor chip are maintained. When forming the functional element 160 such as a decoupling capacitor between the first and second wiring portions, this functional element is desirably placed in a position as close as possible to the electrode of the semiconductor chip. Even when a layer which relaxes the internal stress is added as described above, the functional element 160 can be placed in a position close to the electrode of the semiconductor chip if no interconnections need be formed in the second wiring portion.

The shape of each contact plug in the second wiring portion can be a shape having no land portion at the end portion in the longitudinal direction, or a shape having a land portion at one or both of the two ends in the longitudinal direction. Whether to form a land portion in the contact plug can be appropriately selected.

Wiring Board Manufacturing Method

A wiring board manufacturing method will be explained below. This wiring board manufacturing method comprises the step of forming a first wiring portion having a plurality of wiring layers and a plurality of external connecting bumps, and the step of forming a second wiring portion having a plurality of connecting terminals arranged to be connectable to at least one semiconductor chip, such that the second wiring portion is integrated with the first wiring layer in the direction of thickness. Note that the connecting terminal is made of a contact plug formed in a through hole extending through the second wiring portion in the direction of thickness, that the sizes of the opposing surfaces of the first and second wiring portions are the same, and that the thermal expansion coefficient of the second wiring portion is smaller than that of the first wiring portion and equal to that of the semiconductor chip, as described previously.

Wiring Board Manufacturing Method (First Embodiment)

The first embodiment of the wiring board manufacturing method comprises the first step of forming a plurality of recesses in one surface in the direction of thickness of a base of a second wiring portion, and burying a conductive material in these recesses, the second step of forming at least a portion of a first wiring portion on one surface of the base of the second wiring portion, and the third step of thinning the base of the second wiring portion from the other surface in the direction of thickness to expose the conductive material buried in the recesses, thereby forming contact plugs and obtaining the second wiring portion. Note that the second step belongs to the step of forming the first wiring portion, and the first and third steps belong to the step of forming the second wiring portion.

The individual steps will be explained in detail below with reference to the accompanying drawings. The following explanation will be made by taking as an example a case which uses a thin plate-like silicon base (e.g., a silicon wafer) as the base of the second wiring portion. As the base of the second wiring portion, however, it is also possible to use, e.g., ceramics or photosensitive glass when a plurality of semiconductor chips to be mounted on a wiring board to be manufactured are silicon chips.

(First Step)

The first step forms a plurality of recesses in one surface in the direction of thickness of a silicon base (to be simply referred to as "a base" hereinafter) of a second wiring portion, and fills these recesses with a conductive material. The thickness of the base can be appropriately selected from the range of, e.g., about 100 to 750 µm.

Figure 5A:
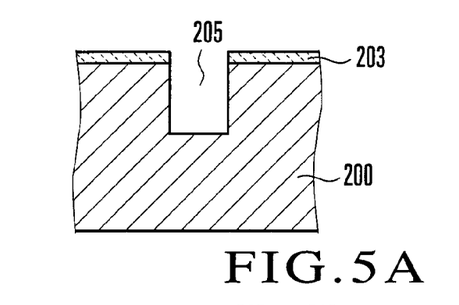
FIG. 5A is a view for explaining a predetermined step of the first embodiment of a wiring board manufacturing method of the present invention.

As shown in FIG. 5A, to form a plurality of recesses 205 (FIG. 5A shows only one recess) in one surface in the direction of thickness of a base 200, an electrical insulating layer 203 is first formed on one surface in the direction of thickness of the base 200 by using, e.g., silicon oxide, silicon nitride, silicon carbide, fluorine-doped silicon oxide, or silicon oxycarbide, and patterned by lithography to form holes in predetermined portions, and the base 200 is etched to a desired depth from these holes by reactive ion etching (RIE) after that. In this manner, the recesses 205 can be formed in the predetermined portions of the base 200. The depth of the recess 205 can be appropriately selected from the range of, e.g., about 50 to 500 µm. Also, when the horizontal sectional shape of the recess 205 is a circle, the diameter of the circle can be appropriately selected from the range of, e.g., about 10 to 150 µm.

Figure 5B:
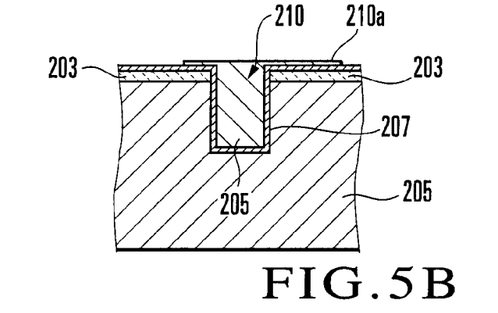
FIG. 5B is a view showing a step following FIG. 5A.

The recess 205 is filled with a conductive material as follows. First, as shown in FIG. 5B, an electrical insulating film is formed on the inner surface of the recess 205 and on the surface of the electrical insulating layer 203 by depositing silicon oxide by, e.g., plasma CVD using TEOS ($Si(OC_2H_5)_4$) gas as one source gas, and copper is deposited on this electrical insulating film by, e.g., sputtering. Referring to FIG. 5B, a layer 207 represents the electrical insulating film (silicon oxide film) formed by plasma CVD and copper deposited by sputtering.

Plasma CVD using TEOS ($Si(OC_2H_5)_4$) gas as one source gas can form an electrical insulating film with high step coverage, so a desired electrical insulating film can be easily formed even when the recess 205 is deep. Also, copper deposited on the electrical insulating film functions as a seed when performing copper plating by the damascene method (a kind of plating).

Copper plating is then performed by the damascene method to fill the recess 205 with a copper plating layer, the copper plating layer formed by the damascene method is planarized by chemical mechanical polishing (CMP), and unnecessary portions of the copper plating layer are removed by etching, thereby leaving a copper plating layer 210 behind in and around the recess 205 as shown in FIG. 5B. A copper plating layer 210a left behind around the recess 205 functions as a land portion of a contact plug (to be described later).

The recess 205 can also be filled by depositing a conductive material by chemical vapor deposition (CVD), instead of copper plating by the damascene method. It is also possible to use a metal material other than copper or a conductive resin as the conductive material.

If necessary, a functional element 160 such as a capacitor, resistor, or inductor can be formed on one surface in the direction of thickness of the base 200 by a thin-film process. Since the base 200 is made of silicon, the functional element 160 can be accurately formed by using various semiconductor diffusion processes. It is also possible to readily reduce the cost such as the installation cost.

(Second Step)

The second step forms at least a portion of a first wiring portion on the one surface of the base 200. The first wiring portion can be formed by a so-called buildup method.

This buildup method repetitively performs, e.g., (1) a first substep of forming an electrical insulating film serving as an interlayer dielectric film, (2) a second substep of forming a predetermined number of via holes in the electrical insulating film, and performing a desmear process if necessary when the via holes are formed by laser processing, (3) a third substep of forming a conductive film serving as a wiring layer, and (4) a fourth substep of forming a wiring layer by patterning the conductive film a desired number of times in the order named, covers regions except for a desired region in the uppermost wiring layer, i.e., a region R to be used as a land portion with a solder resist such as polyimide, and forms an external connecting bump on the region R, thereby obtaining the first wiring portion. Note that the external connecting bump is preferably formed after the third step (to be described later).

Figure 5C:
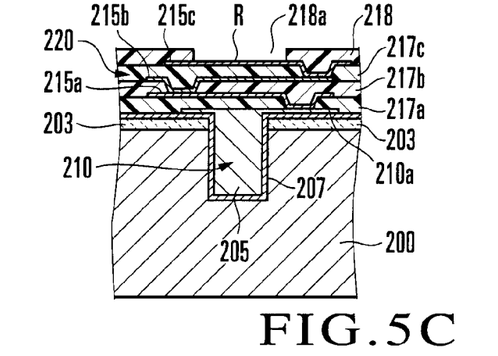
FIG. 5C is a view showing a step following FIG. 5B.

FIG. 5C is a sectional view schematically showing a first wiring portion 220 (except for the external connecting bump) formed by the buildup method on the base 200 having undergone the first step. The first wiring portion 220 shown in FIG. 5C has three interlayer dielectric films 217a, 217b, and 217c, and three wiring layers 215a, 215b, and 215c. Also, a solder resist layer 218 having a hole 218a in a predetermined portion is formed on the wiring layer 215c. The region R, which is exposed from the hole 218a, of the wiring layer 215c is used as a land portion.

When forming the wiring layers 215a, 215b, and 215c, functional elements 160 such as a capacitor, resistor, and inductor can also be formed as needed. The formation of the functional elements 160 facilitates manufacturing a wiring board capable of obtaining a semiconductor device having improved in operating speed and the like. For example, a parallel-plate capacitor obtained by forming the interlayer dielectric film 217b by a ferroelectric material and sandwiching the interlayer dielectric film 217b between the power line and ground line in the wiring layers 215a and 215b can function as a decoupling capacitor.

(Third Step)

The third step thins the base 200 (FIG. 5C) having undergone the first and second steps from the other surface in the direction of thickness to expose the conductive material (copper plating layer 210) buried in the recess 205 formed in the base 200 in the first step, thereby forming a contact plug and obtaining a second wiring portion.

Figure 5D:
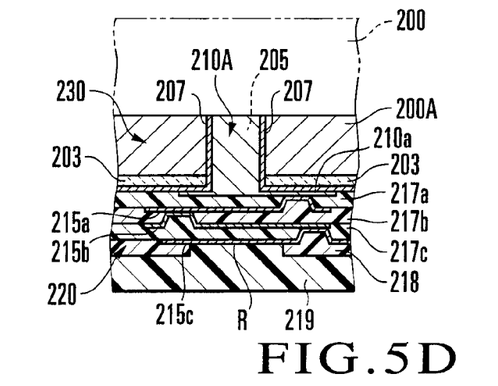
FIG. 5D is a view showing a step following FIG. 5C.

FIG. 5D is a sectional view schematically showing a second wiring portion 230 thus formed. The second wiring portion 230 is formed as follows. First, to protect the solder resist layer 218 and region R formed in the second step, a support 219 covering these portions is formed. Then, the base 200 is thinned to a desired thickness by mechanical polishing and further thinned by RIE from the other surface in the direction of thickness of the base 200, thereby exposing the layer 207 formed on the bottom surface of the recess 205. After that, the base 200 is further polished by CMP until the copper plating layer 210 formed in the recess 205 is exposed. In this manner, the second wiring portion 230 can be obtained. The exposed copper plating layer 210 functions as a contact plug (to be referred to as "a contact plug 210A" hereinafter, and denoted by reference numeral "210A" in FIG. 5D as well).

A strained layer is normally formed on the mechanically polished surface, and this may produce microcracks and decrease the reliability depending on the conditions, so it is necessary to well take account of the conditions such as the amount removed by mechanical polishing and the cutting speed. Also, thinning can be exclusively performed by mechanical polishing as long as the reliability is not influenced. Note that reference numeral "200A" denotes the thinned base 200 in FIG. 5D.

If necessary, a land portion can be formed on the contact plug 210A. For example, this land portion can be formed as follows.

Figure 6A:
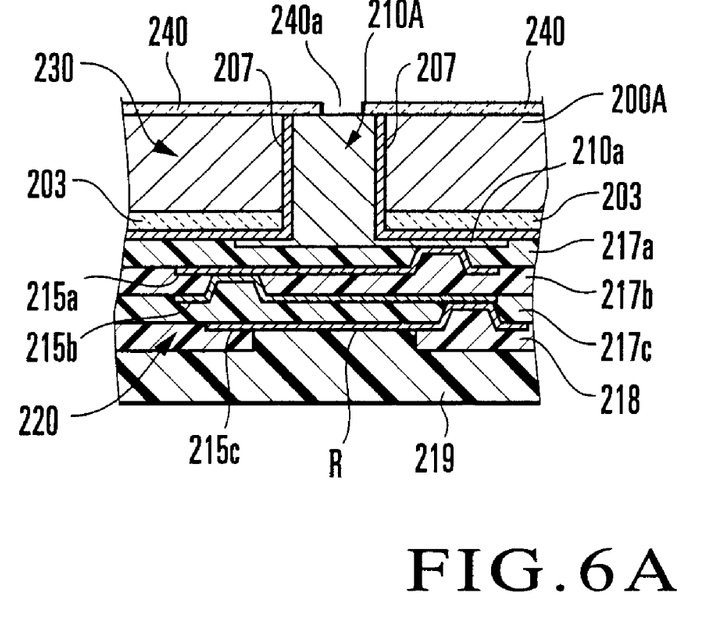
FIG. 6A is a sectional view for explaining a method of forming a land portion on a contact plug in a second wiring portion.
Figure 6B:
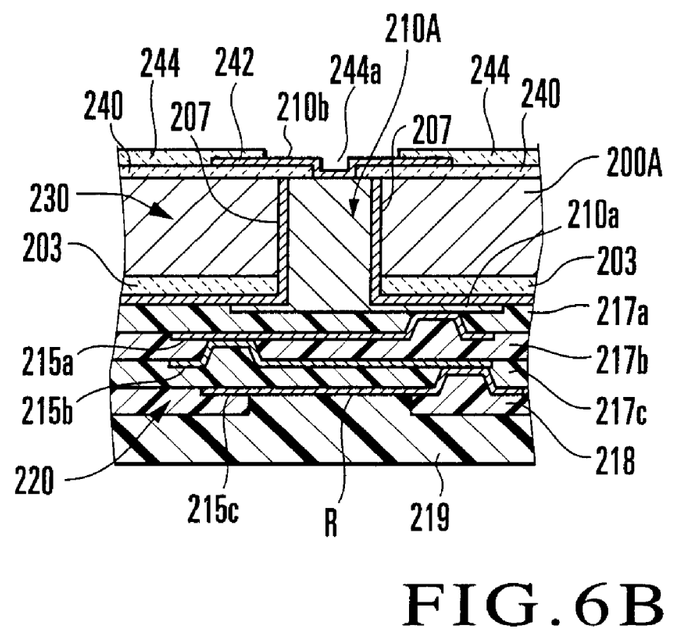
FIG. 6B is a sectional view showing a step following FIG. 6A.

First, as shown in FIG. 6A, a first electrical insulating film 240 is formed on the second wiring portion 230 by silicon oxide or the like, and patterned by photolithography to form a hole 240a on the contact plug 210A. Then, as shown in FIG. 6B, a conductive film 242 having a desired shape is formed to fill the hole 240a, a protective film 244 covering the conductive film 242 is formed by, e.g., silicon oxide, silicon nitride, silicon carbide, fluorine-doped silicon oxide, or silicon oxycarbide, and that region of the protective film 244 which is positioned above the contact plug 210A is removed to form a hole 244a. That region of the conductive film 242 which is exposed in the hole 244a functions as a land portion 210b described above.

A target wiring board is obtained by removing the support 219 after the desired first wiring portion 220 (except for external connecting bumps) and second wiring portion 230 are formed, and forming external connecting bumps after that.

Wiring Board Manufacturing Method (Second Embodiment)

The second embodiment of the wiring board manufacturing method comprises the first step of forming at least a portion of a first wiring portion on one surface in the direction of thickness of a base of a second wiring portion, the second step of forming a plurality of through holes extending through the base of the second wiring portion from the other surface in the direction of thickness of the base, and the third step of burying a conductive material in these through holes and shaping the conductive material buried in the through holes into contact plugs, thereby obtaining the second wiring portion. Note that the first step belongs to the step of forming the first wiring portion, and the second and third steps belong to the step of forming the second wiring portion.

The individual steps will be explained in detail below with reference to the accompanying drawings. The following explanation will be made by taking as an example a case which uses a thin plate-like silicon base (e.g., a silicon wafer) as the base of the second wiring portion. As the base of the second wiring portion, however, it is also possible to use, e.g., ceramics or photosensitive glass when a plurality of semiconductor chips to be mounted on a wiring board to be manufactured are silicon chips.

(First Step)

The first step forms at least a portion of a first wiring portion on one surface in the direction of thickness of a base of a second wiring portion. When using a silicon base (to be simply referred to as "a base" hereinafter) as the base of the second wiring portion, an electrical insulating layer is preferably formed in advance on the surface on which the first wiring portion is to be formed.

Figure 7A:
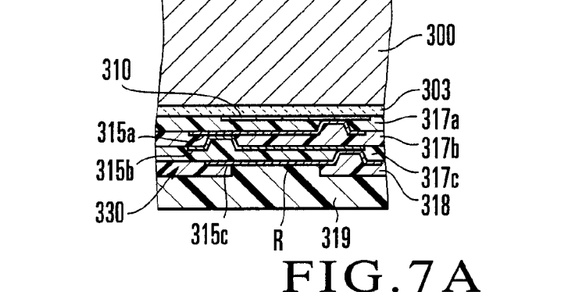
FIG. 7A is a view for explaining a predetermined step of the second embodiment of the wiring board manufacturing method of the present invention.

As shown in FIG. 7A, a first wiring portion 330 is formed on an electrical insulating layer 303 described above formed on a base 300. The first wiring portion 330 can be formed in accordance with the second step of the manufacturing method of the first embodiment explained above. The first wiring portion 330 shown in FIG. 7A has the same arrangement as the first wiring portion 220 shown in FIG. 5C except that a conductive layer 310 as a connecting portion to be connected to a contact plug (to be described later) is formed in a predetermined portion on the electrical insulating film 303, so reference numerals obtained by adding "100" to the same reference numerals as used in the first wiring portion 220 shown in FIG. 5C denote the constituent members, and an explanation thereof will be omitted. External connecting bumps are not formed in the first step but formed after the third step (to be described later) in this embodiment as well. Reference numeral "319" in FIG. 7A denotes a support for protecting a solder resist layer 318 and a predetermined region R (a region to be used as a land portion) in a wiring layer 315c.

(Second Step)

The second step forms a plurality of through holes extending through the base 300 having undergone the first step from the other surface in the direction of thickness of the base 300. Before the formation of these through holes, the base 300 can be thinned as needed. In the first step of forming the first wiring portion 330, it is desirable to use the base 300 having relatively high rigidity. However, the through holes formed in the second step are used to form contact plugs (to be described later), so the base 300 is preferably thin in order to accurately form these contact plugs. A method of forming through holes after thinning the base 300 used in the first step will be explained below as an example.

Note that the base 300 can be thinned by thinning it to a desired thickness by mechanical polishing, and further thinning at least a prospective through hole region and its vicinity by RIE. The rigidity of the thinned base can be held relatively high by further thinning the prospective through hole region and its vicinity by RIE, without performing RIE on other regions.

Figure 7B:
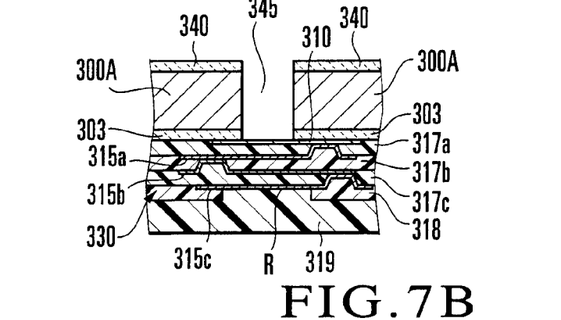
FIG. 7B is a view showing a step following FIG. 7A.

The through hole is formed as shown in FIG. 7B as follows. First, an electrical insulating layer 340 is formed on a thinned base 300A by, e.g., silicon oxide, silicon nitride, silicon carbide, fluorine-doped silicon oxide, or silicon oxycarbide, and patterned by lithography to form a hole in a predetermined portion. Then, the base 300A is etched from the hole over the entire length in the direction of thickness by RIE. In this manner, a through hole 345 is formed as shown in FIG. 7B.

(Third Step)

The third step buries a conductive material in a plurality of through holes 345 formed in the second step, and shaping the conductive material buried in the through holes 345 into contact plugs, thereby obtaining the second wiring portion.

Figure 7C:
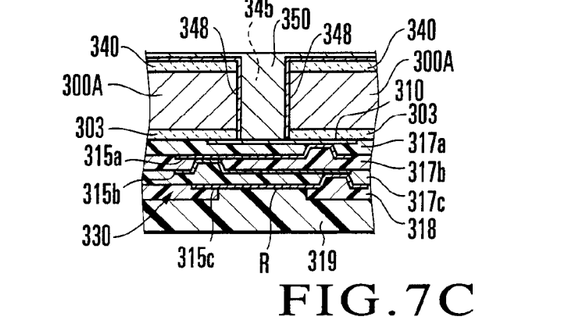
FIG. 7C is a view showing a step following FIG. 7B.

The conductive material is buried in the through hole 345 as follows. For example, a copper layer 348 serving as a seed in the damascene method is formed on the inner surface of the through hole 345 and on the surface of the electrical insulating film 340. Then, as shown in FIG. 7C, copper plating is performed by the damascene method to bury a copper plating layer 350 in the through hole 345. In this case, the copper plating layer 350 is also formed on the electrical insulating layer 340.

Figure 7D:
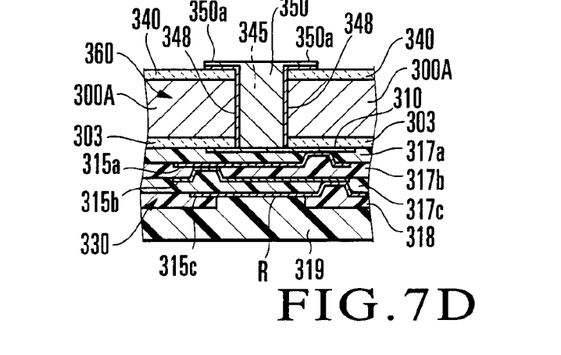
FIG. 7D is a view showing a step following FIG. 7C.

After that, the copper plating layer 350 is planarized by, e.g., CMP, and the copper plating layer 350 and underlying layer 348 are patterned by etching to form a contact plug 355 having a desired shape as shown in FIG. 7D. In this way, a second wiring portion 360 and wiring board 400 are simultaneously obtained.

Figure 8:
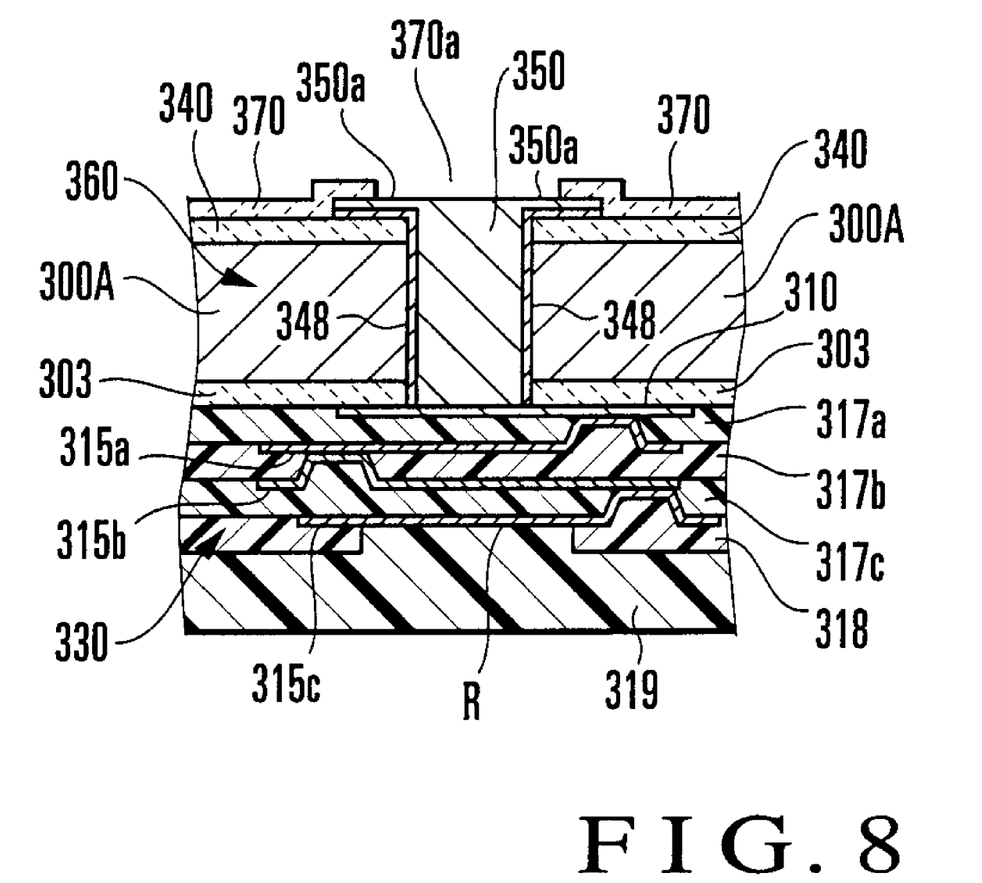
FIG. 8 is a sectional view for explaining another method of forming the land portion on the contact plug in the second wiring portion.

A copper plating layer 350a left behind around the through hole 345 as shown in FIG. 7D can be used as a land portion. In this case, as shown in FIG. 8, an electrical insulating layer 370 preferably covers the edge of the copper plating layer 350a around the through hole 345 and the electrical insulating layer 340. That region of the upper surface of the contact plug 350 which is not covered with the electrical insulating layer 370 functions as a land portion. The electrical insulating layer 370 is obtained by, e.g., forming an electrical insulating layer as a matrix, and forming a hole 370a (FIG. 8) in a predetermined portion of this electrical insulating layer.

A target wiring board is obtained by removing the support 319 after the desired first wiring portion 330 (except for external connecting bumps) and second wiring portion 360, and forming external connecting bumps after that.

Wiring Board Manufacturing Method (Modification)

The manufacturing method of each of the first and second embodiments described above forms the second wiring portion after forming the first wiring portion (except for the external connecting bumps), but the first wiring portion can also be formed after the second wiring portion is formed.

A wiring board can also be obtained by separately forming first and second wiring portions, and bonding them by using an adhesive resin after that. In addition, when the interlayer dielectric film forming the first wiring portion is formed by a resin, the first and second wiring portions can be integrated by separately forming the first and second wiring portions, placing the second wiring portion on the first wiring portion, softening the interlayer dielectric film by heating while the second wiring portion is pressed against the first wiring portion as needed, and cooling the interlayer dielectric film after that.

When separately forming the first and second wiring portions and integrating them after that, the first and second wiring portions can be electrically connected via a separately prepared conductive material (e.g., a solder bump). In this case, the junction portion between the first and second wiring portions can be reinforced, where necessary, by filling a resin in the space between the first and second wiring portions and in the periphery of the space.

Regardless of the method of manufacturing the wiring board, a desired number of reinforcing frame members (stiffeners) can be formed on the second wiring portion.

The semiconductor device, the wiring board, and the manufacturing method thereof of the present invention have been explained by several embodiments, but the present invention is not limited to these embodiments. Various changes, modifications, combinations, and the like are possible.

The invention claimed is:

1. A semiconductor device characterized by comprising:
   a wiring board comprising a plurality of connecting terminals arranged on one surface in a direction of thickness and a plurality of external connecting bumps arranged on the other surface in the direction of thickness; and
   at least one semiconductor chip connected to said connecting terminals,
   wherein said wiring board comprises:
   a first wiring portion comprising a plurality of wiring layers and said external connecting bumps; and
   a second wiring portion electrically connected to said first wiring portion and integrated with said first wiring portion in the direction of thickness,
   said connecting terminals are made of contact plugs formed in through holes extending through the second wiring portion in the direction of thickness,
   sizes of opposing surfaces of said first wiring portion and said second wiring portion are equal, a thermal expansion coefficient of said second wiring portion is smaller than a thermal expansion coefficient of said first wiring portion and equal to a thermal expansion coefficient of said semiconductor chip, said semiconductor chip is a silicon chip, said second wiring portion comprises a base made of silicon, and said contact plugs are formed in said base.

2. A semiconductor device according to claim 1, characterized by further comprising a functional element formed on said second wiring portion which faces said first wiring portion.

3. A semiconductor device according to claim 2, characterized in that said functional element is formed by a thin-film process.

4. A wiring board characterized by comprising:

a first wiring portion comprising a plurality of wiring layers and a plurality of external connecting bumps; and a second wiring portion comprising a plurality of connecting terminals configured to connect to at least one semiconductor chip, wherein said second wiring portion is electrically connected to said first wiring portion and integrated with said first wiring portion in a direction of thickness, said connecting terminals are made of contact plugs formed in through holes extending through said second wiring portion in the direction of thickness, sizes of opposing surfaces of said first wiring portion and said second wiring portion are equal, a thermal expansion coefficient of said second wiring portion is smaller than a thermal expansion coefficient of said first wiring portion and equal to a thermal expansion coefficient of said semiconductor chip, said second wiring portion comprises a base made of silicon, and said contact plugs are formed in said base.

5. A wiring board according to claim 4, characterized by further comprising a functional element formed on said second wiring portion which faces said first wiring portion.

6. A wiring board according to claim 5, characterized in that said functional element is formed by a thin-film process.

7. A wiring board manufacturing method characterized by comprising the steps of:

forming a first wiring portion comprising a plurality of wiring layers and a plurality of external connecting bumps; and forming a second wiring portion comprising a plurality of connecting terminals configured to connect to at least one semiconductor chip, such that the second wiring portion is integrated with the first wiring portion in a direction of thickness, wherein the connecting terminals are made of contact plugs formed in through holes extending through the second wiring portion in the direction of thickness, sizes of opposing surfaces of the first wiring portion and the second wiring portion are equal, a thermal expansion coefficient of the second wiring portion is smaller than a thermal expansion coefficient of the first wiring portion and equal to a thermal expansion coefficient of the semiconductor chip, the step of forming the first wiring portion comprises the step of forming at least a portion of the first wiring portion on one surface in the direction of thickness of a silicon base of the second wiring portion, and the step of forming the second wiring portion comprises the steps of:

forming a plurality of recesses in said one surface of the base;

burying a conductive material in the recesses; and after the step of forming at least a portion of the first wiring portion, thinning the base from the other surface in the direction of thickness of the base to expose the conductive material buried in the recesses, thereby forming the contact plugs and obtaining the second wiring portion.

8. A wiring board manufacturing method according to claim 7, characterized by further comprising the step of forming a functional element on a surface in which the recesses are formed, before the steps of burying the conductive material in the recesses and forming at least a portion of the first wiring portion.

9. A wiring board manufacturing method according to claim 8, characterized in that the step of forming the functional element comprises the step of forming the functional element by a thin-film process.

* * * * *